United States Patent [19]

Iguchi

[11] Patent Number: 5,116,779
[45] Date of Patent: May 26, 1992

[54] PROCESS FOR FORMING SEMICONDUCTOR DEVICE ISOLATION REGIONS

[75] Inventor: Katsuji Iguchi, Yamatokoriyama, Japan

[73] Assignee: Sharp Kabushiki Kaisha, Japan

[21] Appl. No.: 657,770

[22] Filed: Feb. 20, 1991

[30] Foreign Application Priority Data

Feb. 23, 1990 [JP] Japan ................................. 2-43393

[51] Int. Cl.$^5$ ................. H01L 21/302; H01L 21/304; H01L 21/306; H01L 21/76
[52] U.S. Cl. ........................................ 437/67; 437/40; 437/61; 437/64; 437/69
[58] Field of Search ................ 437/67, 69, 40, 64, 437/61

[56] References Cited

U.S. PATENT DOCUMENTS

| | | | |
|---|---|---|---|
| 4,546,538 | 10/1985 | Suzuki | 437/67 |
| 4,666,556 | 5/1987 | Fulton et al. | 437/67 |
| 4,666,557 | 5/1987 | Collins et al. | 437/67 |
| 4,671,851 | 6/1987 | Beyer et al. | 437/69 |
| 4,876,214 | 10/1989 | Yamaguchi et al. | 437/67 |

FOREIGN PATENT DOCUMENTS

| | | | |
|---|---|---|---|
| 278159 | 8/1988 | European Pat. Off. . | |
| 296754 | 12/1988 | European Pat. Off. . | |
| 58-175843 | 10/1983 | Japan | 437/67 |
| 59-227136 | 12/1984 | Japan | 437/69 |
| 63-239971 | 10/1988 | Japan | 437/67 |

OTHER PUBLICATIONS

IBM Technical Disclosure Bulletin, vol. 28, No. 6, Nov. 1985, pp. 2583-2584; "Trench Filling Process".
IBM Technical Disclosure Bulletin, vol. 29, No. 3, Aug. 1986, pp. 1240-1242, "Process for Trench Planarization".
"Apractical Trench Isolation Technology with a Novel Planarization Process", pp. 732-735.
"A New Trench Isolation Technology as a Replacement of Locos", pp. 578-581.
"Buries-Oxide Isolation with Etch-Stop (Boxes)-"-IEEE Electron Device Letters, vol. 9, No. 2, Feb. 1988-pp. 62-64.
IBM Technical Disclosure Bulletin-vol. 24, No. 7B, Dec. 1981, pp. 3684-3688.
IBM Technical Disclosure Bulletin-vol. 23, No. 11, Apr. 1981, pp. 4917-4919.

Primary Examiner—Brian E. Hearn
Assistant Examiner—Kevin M. Picardat
Attorney, Agent, or Firm—Nixon & Vanderhye

[57] ABSTRACT

A process for forming a semiconductor device isolation region which comprises:

a) forming on a silicon substrate at least a first thin silicon oxide film and a first silicon nitride film thereon, b) etching the substrate using a resist pattern to form a trench for providing an isolation region, c) forming a second silicon oxide film and a second silicon nitride film on the side walls and bottom wall of the trench, d) subsequently forming a first polycrystalline silicon film on the substrate including the trench, leaving the first polycrystalline silicon film only on the side walls of the trench by anisotropic etching and thereafter oxidizing the remaining first polycrystalline silicon film to form an oxide film on the side walls of the trench, and e) further forming a second polycrystalline silicon film over the semiconductor substrate including the trench, leaving the second polycrystalline silicon film only between the oxide film portions on the side walls of the trench by anisotropic etching and thereafter oxidizing the remaining second polycrystalline silicon film to thereby form an oxide film.

6 Claims, 8 Drawing Sheets

PROCESS FOR FORMING SEMICONDUCTOR DEVICE ISOLATION REGIONS

BACKGROUND OF THE INVENTION (a) Field of the Invention

The present invention relates to a process for forming isolation regions for electrically isolating devices constituting semiconductor integrated circuits, and more particularly to a process for forming trench isolation regions by forming device isolation trenches in a semiconductor substrate and refilling the trenches with an insulation film.

(b) Description of the Prior Art

The packing density, for example, of DRAMs (dynamic random access memories) has increased approximately at a rate of fourfold every three years, and with this trend, the minimum line width of circuits has decreased by about 60% to 70% from generation to generation. Consequently, 1 Mb DRAM and 4 Mb DRAM presently made available by mass production are 1.2 μm and 0.8 μm, respectively, in minimum line width. Further 16 Mb DRAMs which have yet to be produced in quantities are 0.6 to 0.5 μm in minimum line width. 64 Mb DRAMs to be developed in the future will be 0.4 to 0.3 μm in minimum line width.

With semiconductor devices thus made more microscopic, the isolation regions for isolating the devices from one another have become gradually narrower. In minimum isolation width, 4 Mb DRAMs are 1.0 to 0.8 μm, 16 Mb DRAMs are 0.8 to 0.6 μm, and 64 Mb DRAMs will be reduced to 0.5 to 0.4 μm.

The device isolation regions having a width of at least 0.6 μm can be formed by local oxidation of silicon isolation (LOCOS process) or improved LOCOS process. The LOCOS process is such that a silicon nitride film covering a silicon substrate is apertured by patterning, and the exposed silicon substrate surface is selectively oxidized to form a silicon oxide film serving as an insulation film.

For the following reason, however, the LOCOS process is unable to form isolation regions of up to 0.5 μm. Unless the oxide film on the isolation regions is made extremely thin, the LOCOS process permits oxidation of the silicon substrate to progress to regions covered with the silicon nitride film to result in side-wise extensions of silicon oxide film called bird's beaks. Thus, the isolation regions spread out beyond the mask size, making it impossible to form narrow isolation regions.

As an alternative to the LOCOS process, the so-called trench isolation process has been proposed. With this process, a resist pattern formed by lithography is used as an etching mask to form recessed trenches in a silicon substrate, and the trenches are filled up with an insulator such as a silicon oxide film.

FIGS. 4(a) to (e) are diagrams showing the conventional trench isolation process, which will be described with reference to FIG. 4(a) to (e).

Figure 4:
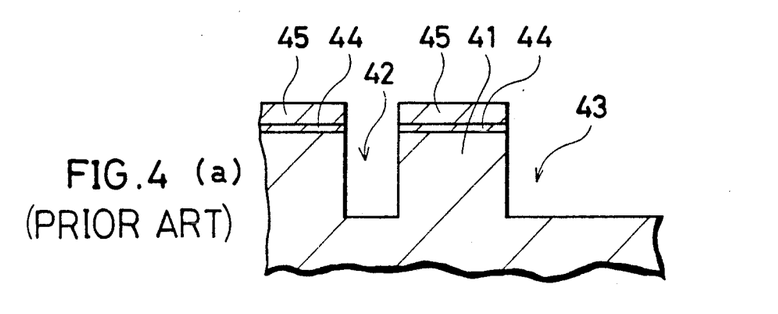
FIGS. 4(a) to (e) are steps illustrating the conventional trench isolation process.

(1) First, a thin oxide film 44 is formed over the surface of a silicon substrate 41, a polycrystalline silicon film 45 is thereafter deposited on the film, and the portions 42, 43 to be made into isolation regions are etched by reactive ion etching to form a trench 42 of small width and a trench 43 of large width (FIG. 4, (a)).

(2) Next, the inside of the trenches 42, 43 is cleaned, the surface is oxidized to form a thin oxide film 46 and subsequently coated with a thin silicon nitride film 47, and a silicon oxide film 48 of a thickness approximately corresponding to the depth of the trenches is deposited on the nitride film to fill up the trenches. This step produces a higher step 49 around the wide isolation region 43 (FIG. 4, (b)).

(3) A dummy resist layer 50 is then formed on the wide isolation region 43 so that the silicon oxide film 48 will not be removed from this region 43 when the silicon oxide film 48 is removed from the active regions for forming transistors. After the dummy resist layer 50 has been formed, polyimide resin 51 is coated on the surface to fill up the space between the dummy resist layer 50 and the step 49 to form a planar surface (FIG. 4, (c)).

(4) Next, to remove the polyimide resin 51 and the oxide film 48 on the active regions, the entire surface is etched by reactive etching at equal rates for the polyimide resin, the resist resin material and the oxide film. The etching is stopped upon the polycrystalline silicon film 45 appearing on the surface (FIG. 4, (d)).

(5) The polycrystalline silicon film 45 is etched away, the surface is cleaned and the oxide film 44 is further removed with hydrofluoric acid, followed by a transistor forming process (FIG. 4, (e)).

Thus, the use of the trench isolation process forms trench regions which only serve as the isolation regions, so that the isolation width can be reduced to a value limited by lithograph. The trench isolation process is therefore suitable for isolating the devices of semiconductor integrated circuits of increased packing densities.

In the conventional trench isolation process described above, however, the oxide film 48 deposited in the step (2) is as thick as about 1 μm. In order to fill the trenches completely, there is a need to resort to the LP CVD (Low Pressure Vapor Deposition) process with good step-coverage. This method nevertheless has the drawbacks of being low in film deposition rate and poor in throughput.

Further, in the case that the total thickness of the resin film and the oxide film is about 2 microns, the oxide film will be overetched by 800 angstroms at portions where the etching proceeds at the highest rate, even if the in-plane uniformity of the equal-rate etching condition for the resin film and the oxide film is within ±2% Accordingly, unless the rate of etching of the polycrystalline silicon film 45 is very small under the equal-rate etching condition, the active regions also are etched and thereby damaged. Even if the etching is stopped at the polycrystalline silicon film 45 as desired, a distinct step with a height of about 800 angstroms will occur between the isolation region and the active region.

When the surface of the oxide film within the trench is lower than the silicon surface in the active region, an electric field will be concentrated at the edge of the active region since the wiring for the gate electrode is so provided as to cover the corner portion of the active region. This field concentration gives rise to the problem that a leak current occurs in the subthreshold region of the transistor.

Further as shown in FIG. 4, (e), the treatment with hydrofluoric acid creates a wedgelike minute ditch 52 in the center of the trench 42 with a large aspect ratio. Usually the formation of the isolation regions is followed by the formation of the gate insulation film and gate electrode wiring for MOS transistors. The presence of the minute ditch 52 in the isolation region entails the problem of a break in the wiring, or a short circuit between the wirings, which would occur if the wiring material remains in the minute ditch.

The known references on a semiconductor device isolation technology are as follows.

1. "A NEW TRENCH ISOLATION TECHNOLOGY AS A REPLACEMENT OF LOCOS"
   H. Mikoshiba, T. Homma and K. Hamano
   IEDM Technical Digest, 1984 P578~581
2. "A PRACTICAL TRENCH ISOLATION TECHNOLOGY WITH A NOVEL PLANARIZATION PROCESS"
   G. Fuse et al.
   IEDM Technical Digest, 1987 P732~735
3. "BURIED-OXIDE ISOLATION WITH ETCH-STOP (BOXES)"
   Robert F. Kwasnick et al.
   IEEE ELECTRON DEVICE LETTERS. Vol. 9, No. 2
   Feb. 1988
4. IBM Technical Disclosure Bulletin Vol. 23, No. 11 Apr. 1981
5. IBM Technical Disclosure Bulletin Vol 24, No. 7B Dec. 1981

SUMMARY OF THE INVENTION

An object of the present invention is to overcome the problems peculiar to the conventional trench isolation process, such as impairment of electrical characteristics due to etching damage, impairment of transistor characteristics due to a step produced on a border between an active region and isolation region, or short circuits between the wirings due to a minute ditch produced in the center of an isolation region, and to provide a relatively simple isolation process with trench isolation technology, which is suitable for semiconductor integrated circuits with increased packing density.

To accomplish the above object, the present invention provides a process for forming a semiconductor device isolation region which comprises: a) forming on a silicon substrate at least a first thin silicon oxide film and a first silicon nitride film thereon, b) etching the substrate using a resist pattern to form a trench for providing an isolation region, c) forming a second silicon oxide film and a second silicon nitride film on the side walls and bottom wall of the trench, d) subsequently forming a first polycrystalline silicon film on the substrate including the trench, leaving the first polycrystalline silicon film only on the side walls of the trench by anisotropic etching, and thereafter oxidizing the remaining first polycrystalline silicon film to form an oxide film on the side walls of the trench, and e) further forming a second polycrystalline silicon film over the semiconductor substrate including the trench, leaving the second polycrystalline silicon film only between the oxide film portions on the side walls of the trench by anisotropic etching, and thereafter oxidizing the remaining second polycrystalline silicon film to thereby form an oxide film.

Unlike the conventional process, the process of the present invention does not include the step of depositing a thick oxide film and etching back the oxide film. Therefore, the present process is free from the damage of the active region and steps between the active region and the device isolation region, which was induced by the overetching. The first polycrystalline silicon film may have a thickness of about 0.1 μm corresponding to about ¼ of a minimum trench width, and the second polycrystalline silicon film may have a thickness of about one-half of the depth of the trench. Such thin polycrystalline silicon films can be etched under conditions with a large selectivity relative to the underlying oxide film and nitride film. This remarkably diminishes the likelihood of causing damage to the active region and eliminates a large step at the boundary between the active region and the trench, consequently precluding the impairment of the electrical characteristics and the impairment of the transistor threshold characteristics.

Furthermore as stated above, the first and second polycrystalline silicon films are much thinner than the 1 μm-thick oxide film used in the conventional trench isolation process, so that the silicon films can be deposited within a short time to achieve an improved throughput.

Since the oxide films inside the trench are not formed by deposition, no minute ditch appears at the center of the trench. This prevents short circuits between the wirings due to such a ditch.

When the LOCOS process is employed in combination with the present process, the LOCOS oxidation for wide isolation regions can be done at the same time of the second polycrystalline silicon oxidation.

DESCRIPTION OF THE PREFERRED EMBODIMENTS

The present invention will be described below in greater detail with reference to the illustrated embodiments.

Embodiment 1

FIGS. 1(a) to (h) are process steps showing a first embodiment of the invention for forming device isolation regions. The embodiment will, be described below with reference to FIGS. 1(a) to (h). The following steps (a), (b), (c), (d), (e), (f), (g) and (h) correspond to FIG. 1, (a), (b), (c), (d), (e), (f), (g) and (h), respectively. (a) A p-type silicon substrate 1 is oxidized to form a tin oxide film 2 on the substrate surface, a silicon nitride film 3 is then deposited on the film 2, and a silicon oxide film 4 is thereafter deposited on the film 3 by the CVD process. Subsequently, a resist pattern (not shown) of isolation regions is formed by stepper (aligner). Using the pattern as a mask, the superposed films 2, 3 and 4 are removed by reactive ion etching. After removing the resist pattern, the silicon substrate 1 is treated by reactive ion etching with the pattern of oxide film 4 serving as a mask to form a trench 5 which is 0.5 to 1.0 μm in width and 0.6 μm in depth. Although the mask of oxide film 4 is used for etching the silicon substrate in the present step, the substrate may be etched with use of the resist pattern as the mask in the absence of the oxide film 4.

(b) The inside of the trench 5 is cleaned with an acid, the oxide film 4 is then etched away, and the inside of the trench is oxidized with a mixed gas of hydrochloric acid and oxygen. A thin oxide film formed by the oxidation treatment is etched away, and the inside of the trench is oxidized again to form a thin oxide film 6 again. A thin silicon nitride film 7 is further formed on the film 6 LP CVD. The silicon nitride film 7 serves to prevent the oxidation of the inside walls of the trench in a later oxidation step.

(c) Next, a polycrystalline silicon film with 0.1 μm in thickness is deposited by LP CVD. The entire surface of the film is subjected to a reactive ion etching process with anisotropic characteristics and a large selectivity relative to the silicon nitride film in order to leave the polycrystalline silicon film 8 only on the side walls of the trench 5. Most preferably, the polycrystalline silicon film has a thickness that provides an oxide film, by complete oxidation, having a thickness approximately one-half of the minimum width of trenches. Since a silicon film gives an oxide film with a thickness approximately twice the original silicon film thickness by oxidation, the thickness of the polycrystalline silicon film is about on-fourth of the minimum-trench width.

(d) Next, the polycrystalline silicon film 8 is oxidized in a wet ambient at 1050° C. to form an oxide film 9 on the inner side walls of the trenches. Consequently, there remains a groove 10 between the oxide film portions 9, 9. The groove 10 is narrow in the case where the trench has a small width, and is relatively wide in the case where the trench has a large width. The surface of the silicon substrate 1 is protected by the silicon nitride films 3 and 7 and therefore remains unoxidized in the present step.

Figure 1:
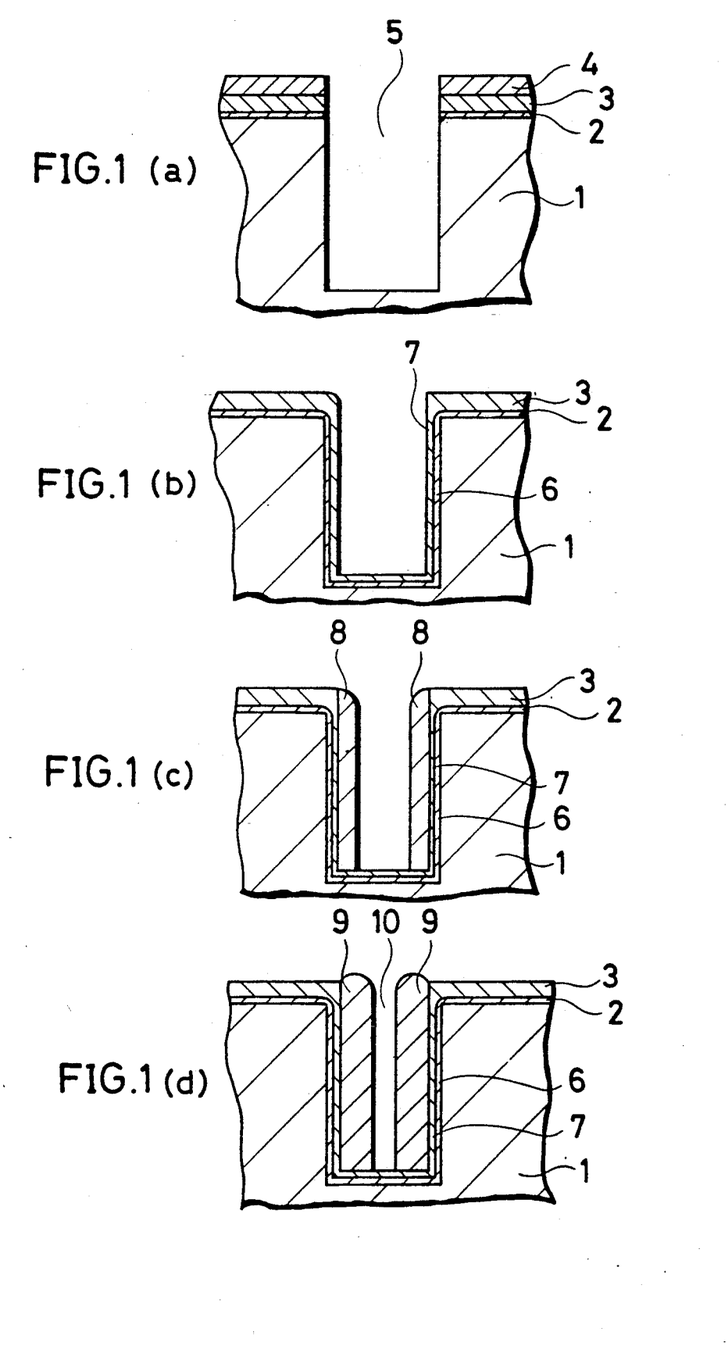
FIGS. 1(a) to (h) are process steps showing a first embodiment of the present invention.
Figure 1E:
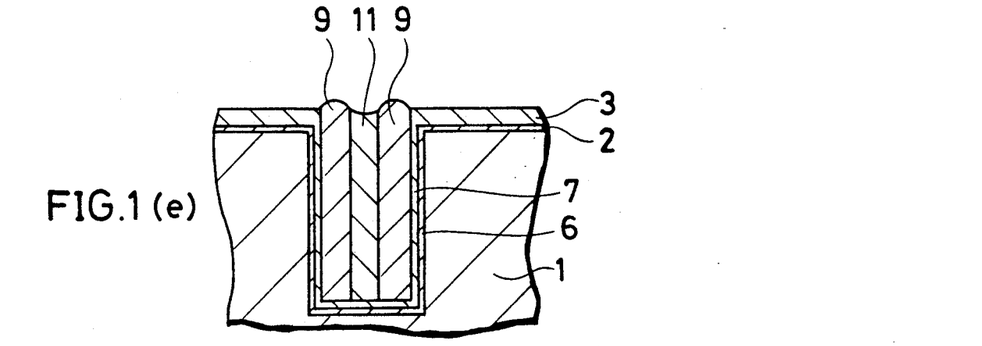

(e) To fill up the groove 10 remaining at the center of the trench 5, a polycrystalline silicon film with a thickness of 0.3 μm is deposited again and is etched back in the same manner as in the step (c) to fill the polycrystalline silicon 11 in the groove 10. The thickness of the polycrystalline silicon film deposited in this step is preferably larger than one-half of the width of the groove 10 in the trench of the largest width.

Figure 1F:
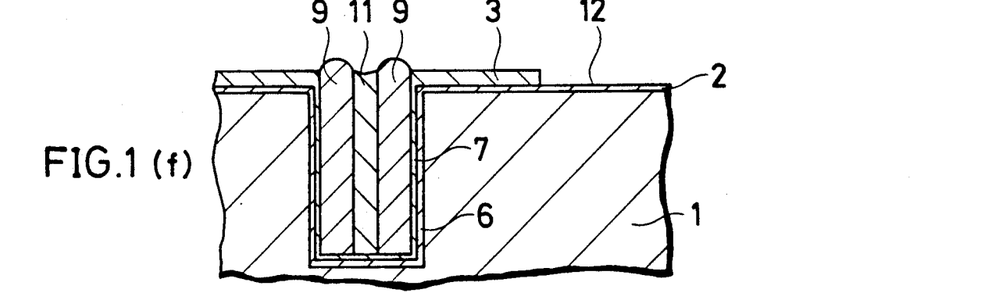

(f) To oxidize the surface of the polycrystalline silicon in the trench 5 and to form a wide device isolation region 12 by local oxidation at the same time, the silicon nitride film 3 on the region 12 is etched off.

Figure 1G:
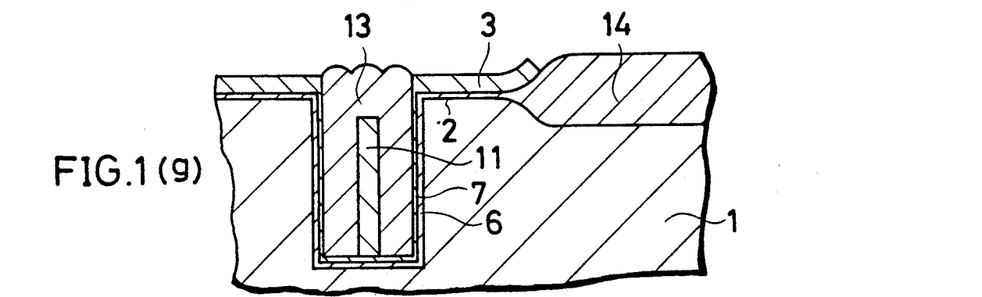

Then, wet oxidation at an oxidation temperature of 1050° C. or above follows to grow an oxide film 13 on the surface of the polycrystalline silicon 11 in the groove 10 and to form a wide isolation region 14.

According to the present embodiment, the LOCOS process is thus incorporated in the steps (f) and (g) to form the wide isolation region concurrently with the oxidation of the polycrystalline silicon film, so that isolation regions of varying widths can be formed efficiently.

Figure 1H:
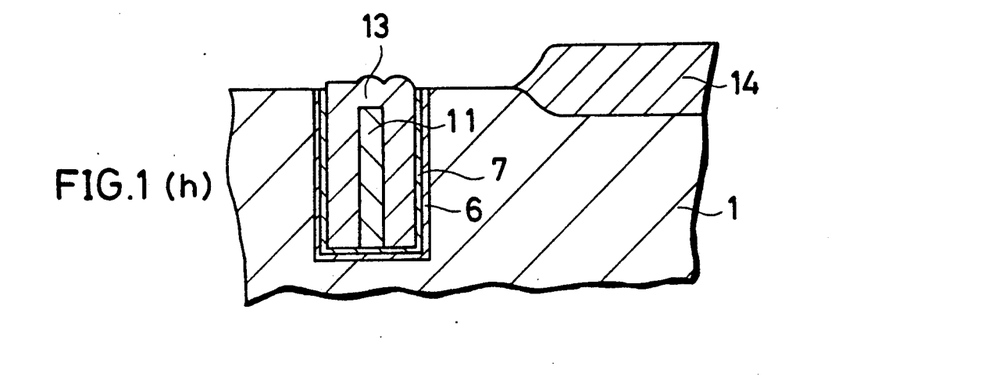
Figure 2:
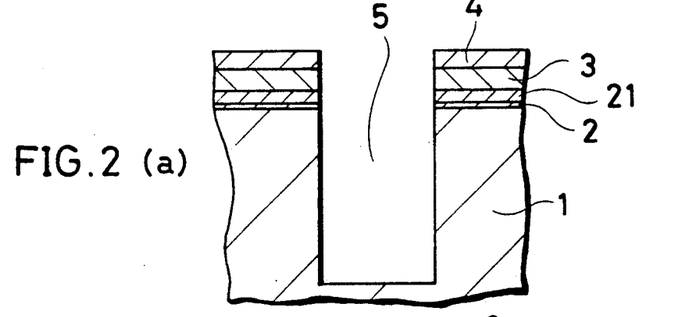
FIGS. 2(a) to (h) are process steps showing a second embodiment of the invention.

(h) The final step removes the silicon nitride film 3 and the thin oxide film 2 t complete device isolation regions.

After the completion of the foregoing processes for forming the isolation regions, MOS transistors and other device are formed on the surface of the silicon substrate 1 by the known process.

According to the present embodiment, device isolation regions having a very small width of 0.5 μm were formed. Further N-type MOS transistors (not shown) were formed, which had a channel length of 0.5 μm and the isolation regions of very small width. When the transistors were tested, no increase in the junction leak current was found as compared with that of transistors separated by the conventional LOCOS process. Further, despite the isolation width of 0.5 μm, the leak current of the parasitic MOS transistors was not larger than the conventional level. Additionally, the transistors operated with satisfactory characteristics despite the channel width of 0.5 μm which was not available by the LOCOS process.

Embodiment 2

FIGS. 2(a) to (h) shows a process diagram of the second embodiment of the present invention. The steps of the present embodiment illustrated in FIG. 2, (a), (b), (c), (d), (e), (f), (g) and (h) correspond to the steps of FIG. 1, (a), (b), (c), (d), (e), (f), (g) and (h), respectively, with the exception of the following feature. Therefore, a detailed description will not be given.

The present embodiment employs the polycrystalline silicon pad LOCOS process which is an improvement of the LOCOS process, and in this respect, the embodiment differs from the first embodiment. In connection with the use of the polycrystalline silicon pad LOCOS process, a polycrystalline silicon film 21 serving as a pad is formed between the thin oxide film 2 and the nitride film 3 in the step (a).

The present embodiment had the same advantages as the first embodiment.

Embodiment 3

FIGS. 3(a) to (h) show the process of the third embodiment. The following steps of the present embodiment (a), (b), (c), (d), (e), (f), (g) and (h) correspond to the steps of FIG. 3, (a), (b), (c), (d), (e), (f), (g) and (h), respectively. Like the second embodiment, the present embodiment also employs the polycrystalline silicon pad LOCOS process which is an improvement of the LOCOS process. Unlike the first and second embodiments, however, in the present embodiment, the oxidation for wide isolation is done separately from the oxidation of th second polycrystalline silicon film.

(a) First, a p-type silicon substrate 1 is oxidized to form a thin oxide film 2 on the substrate surface, a silicon nitride film 3 is then deposited on the film 2, and an oxide film 4 is thereafter deposited on the film 3 by the CVD process. Subsequently, a resist pattern (not shown) of isolation regions is formed by stepper. Using the pattern as a mask, the superposed films 2, 3 and 4 are removed by reactive ion etching. After removing the resist pattern, the silicon substrate 1 is treated by reactive ion etching with the pattern of oxide film 4 serving as a mask to form a trench 5 which is 0.5 to 1.0 μm in width and 0.6 μm in depth. Although the mask of oxide film 4 is used for etching the silicon substrate in the present step, the substrate may be etched with use of the resist pattern as the mask in the absence of the oxide film 4.

(b) The inside of the trench 5 is cleaned with an acid. The inside of the trench is oxidized with a mixed gas of hydrochloric acid and oxygen to form a thin oxide film, where the oxide film 4 is left as it is. The thin oxide film formed by the oxidation treatment is etched away, and the inside of the trench is oxidized again to form a thin oxide film 6 again. A silicon nitride film 7 is further deposited on the film 6 by LP CVD. The silicon nitride film 7 serves to prevent the oxidation of the inside walls of the trench in a later oxidation step.

(c) Next, a polycrystalline silicon film with 0.1 μm-thickness, is deposited by LP CVD. The entire surface of the film is etched back by a reactive ion etching process with anisotropic characteristics and a large selectivity relative to the silicon nitride film in order to leave the polycrystalline silicon film 8 only on the side walls of the trench 5. As already stated, it is most preferable that the polycrystalline silicon film has a thickness that provides an oxide film, by complete oxidation having a thickness approximately one-half of the minimum width of trenches. Since a silicon films gives an oxide film with a thickness approximately twice the original silicon film thickness by oxidation, the thickness of the polycrystalline silicon film is about one-fourth of the minimum trench width.

(d) Next, the polycrystalline silicon film 8 is oxidized in a wet ambient at 1050° C. to form an oxide film 9 on the inner side-walls of the trenches 5. Consequently, there remains a groove 10 between the oxide film portions 9, 9. The groove 10 is narrow in the case where the trench has a small width, and is relatively wide in the case where the trench has a large width. The surface of the silicon substrate 1 is protected by the silicon nitride films 3 and 7 and therefore remains unoxidized in the present step.

Figure 3:
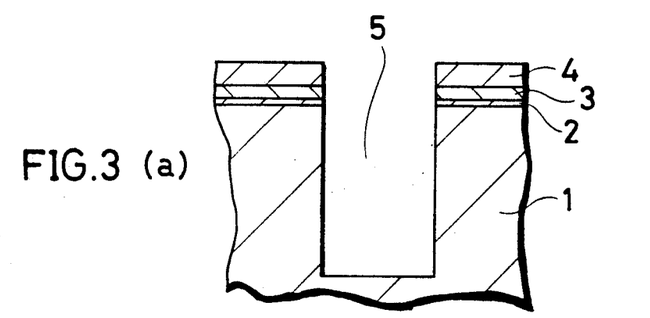
FIGS. 3(a) to (h) are process steps showing a third embodiment of the invention.
Figure 3E:
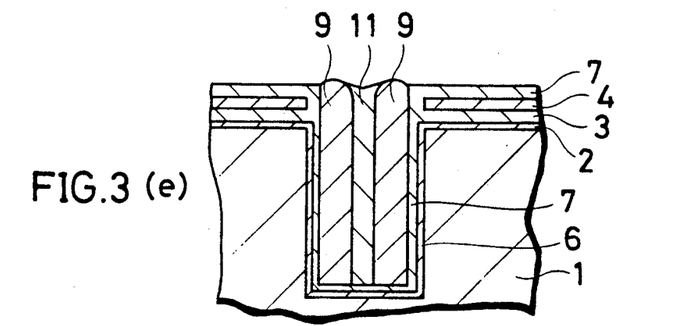

(e) To fill up the groove 10 remaining at the center of the trench 5, a polycrystalline silicon film with a thickness of 0.3 μm is deposited again, and entire surface is etched back in the same manner as in the step (c) to fill the polycrystalline silicon 11 in the groove 10. The thickness of the polycrystalline silicon film deposited in this step is preferably larger than one-half of the width of the groove 10 in the trench of the largest width.

Figure 3F:
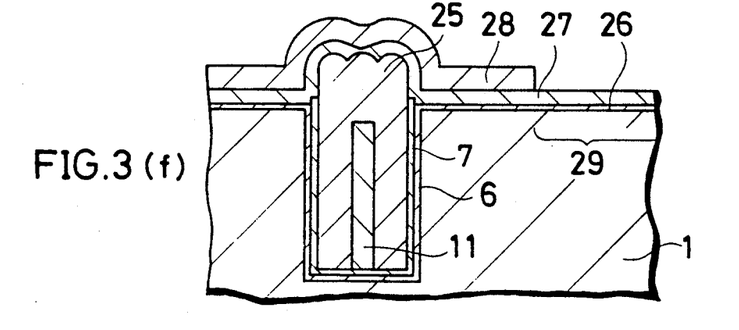

(f) The surface of the polycrystalline silicon 11 in the trench is then oxidized in wet ambient at 1050° C. to form an oxide film 25. And the silicon nitride film 7, the oxide film 4, the silicon nitride film 3 and the oxide film 2 are thereafter etched away by wet process in succession. To provide a wide isolation region by the polycrystalline pad LOCOS process, a pad oxide film 26, a polycrystalline silicon film 27 and a silicon nitride film 28 are formed subsequently, and the silicon nitride film 28 is etched away by reactive ion etching to the isolation region 29.

Figure 3G:
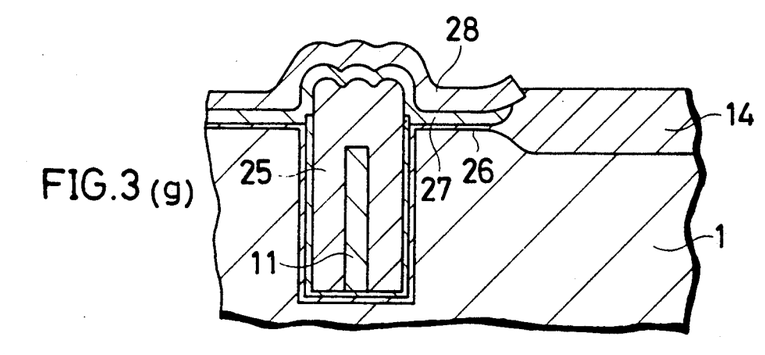

(g) Then, wet oxidation at an oxidation temperature of 1050° C. or above follows to form a wide isolation region 14. Unlike the first and second embodiments described, in the present embodiment, the oxidation of the polycrystalline silicon film in the trench and oxidation for forming the wide isolation region are done in different steps.

In the case where such wide isolation regions include a trench isolation region, the polycrystalline silicon film 11 is also oxidized after the complete oxidation of the polycrystalline silicon film 27 on the trench.

Figure 3H:
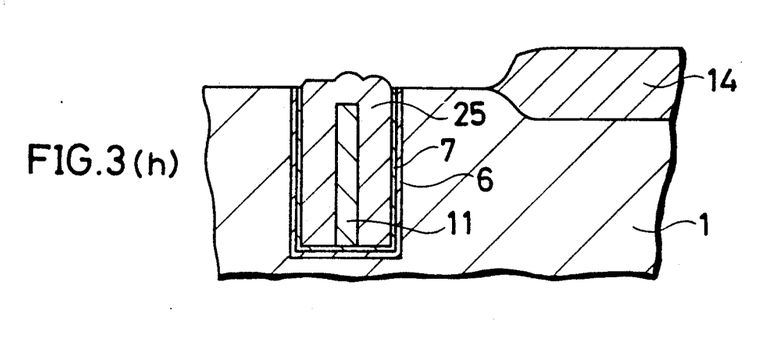

(h) Finally, the silicon nitride film 28 and the polycrystalline silicon film 27 are removed, and the thin oxide film 26 is further removed to complete device isolation regions.

After the completion of the foregoing processes for forming the isolation regions, MOS transistors and other devices are formed on the surface of the silicon substrate 1 by the known process.

The present embodiment also had the same advantages as the first embodiment described.

As will be apparent from the above description, the process of the present invention does not include the steps, peculiar to the convention trench isolation process, of depositing a thick oxide film and etching back the thick film. So, the present process is therefore free from damage of the active region and steps at the boundary between the active region and the trench isolation region, which are induced by the overetching. This precludes impairment of the electrical characteristics due to etching damage to the active region and impairment of the device characteristics due to imperfect flatness.

Furthermore, the first and second polycrystalline silicon films are thinner than the 1 μm-thick oxide film used in the conventional trench isolation process. The film deposition time can therefore be shorter to achieve an improved throughput.

Further, according to the present invention, polycrystalline silicon is buried in the trench and then oxidized to form an oxide film in the trench. This method obviates a minute ditch at the center of the trench, which is inevitable to CVD-oxide film filled in trench. Consequently, the method prevents short circuits between the wirings.

Accordingly, when integrated circuits are fabricated using the process of the present invention, the semiconductor devices can be insulated and isolated satisfactorily by very small isolation regions, so that the present process contributes to great improvements in the packing density and provides integrated circuits in high yields with high reliability.

Further, according to the present invention, wide isolation regions can be oxidized by the LOCOS process concurrently with the oxidation of the polycrystalline silicon film. This leads to the advantage that device isolation regions with varying widths can be formed efficiently.

What is claimed is:

1. A process for simultaneously forming semiconductor device isolation regions having various widths which comprises:
   a) forming on a silicon substrate at least a first thin silicon oxide film and a first silicon nitride film thereon,
   b) etching the substrate to form a trench for providing a narrow isolation region,
      forming a second silicon oxide film and a second silicon nitride film on the side walls and bottom wall of the trench,
      subsequently forming a first polycrystalline silicon film on the substrate including the trench, leaving the first polycrystalline siliconfilm only on the side walls of the trench by anisotropic etching, and thereafter oxidizing the remaining first polycrystalline silicon film to form an oxide film on the side walls of the trench,
      further forming a second polycrystalline silicon film over the semiconductor substrate including the trench, leaving the second polycrystalline silicon film only between the oxide film portions on the side walls of the trench by anisotropic etching,
   c) etching the part of said first silicon nitride film which will form a wide isolation region, and
   d) thereafter simultaneously oxidizing both the remaining second polycrystalline silicon film and said etched part of the siliconnitride film to thereby form oxide films.

2. A process of claim 1 in which in the step (a), the first thin silicon oxide film is formed by oxidizing the silicon substrate and a silicon oxide film is further formed on the first silicon nitride film by a CVD method.

3. A process of claim 2 in which in the step (a), a polycrystalline silicon film is further formed between the first thin silicon oxide film and the first silicon nitride film.

4. A process of claim 1 in, which the second silicon nitride film of the step (b) is formed by a LP CVD method.

5. A process of claim 1 in which the thickness of the first polycrystalline silicon film is about one-fourth of a minimum width of the trench.

6. A process of claim 1 in which the thickness of the second polycrystalline silicon film of the step (b) is one-half or more of a maximum width between the oxide film portions on the side walls of the trench.

* * * * *